(12) United States Patent
Basol

(10) Patent No.: US 7,537,955 B2
(45) Date of Patent: May 26, 2009

(54) LOW TEMPERATURE NANO PARTICLE PREPARATION AND DEPOSITION FOR PHASE-CONTROLLED COMPOUND FILM FORMATION

(76) Inventor: Bulent M. Basol, 3001 Maple Ave., Manhattan Beach, CA (US) 90266

( * ) Notice: Subject to any disclaimer, the term of this patent is extended or adjusted under 35 U.S.C. 154(b) by 296 days.

(21) Appl. No.: 11/123,886

(22) Filed: May 4, 2005

(65) Prior Publication Data

US 2005/0266600 A1    Dec. 1, 2005

Related U.S. Application Data

(63) Continuation-in-part of application No. 10/474,259, filed on May 19, 2004, now Pat. No. 7,091,136, and a continuation-in-part of application No. 11/070,835, filed on Mar. 1, 2005.

(60) Provisional application No. 60/567,459, filed on May 4, 2004, provisional application No. 60/548,297, filed on Mar. 1, 2004, provisional application No. 60/283,630, filed on Apr. 16, 2001.

(51) Int. Cl.
*H01L 21/00* (2006.01)
*H01L 31/00* (2006.01)
*B05D 5/12* (2006.01)
*B05D 7/00* (2006.01)

(52) U.S. Cl. .................... 438/57; 427/74; 427/216; 136/252; 136/253; 136/254; 136/255; 136/256; 136/257; 136/258; 136/259; 136/260; 136/261; 136/262; 136/263; 136/264; 136/265

(58) Field of Classification Search ............. 427/74, 427/216; 438/57; 136/240–265
See application file for complete search history.

(56) References Cited

U.S. PATENT DOCUMENTS 4,659,384 A * 4/1987 Daigo et al. ............... 106/35

(Continued)

FOREIGN PATENT DOCUMENTS

EP    0 838 864 A2    4/1998

(Continued)

OTHER PUBLICATIONS

Subramanian et al., Cu-Ga (Copper Gallium), Binary Alloy Phase Diagrams, pp. 1410-1412, undated.

(Continued)

*Primary Examiner*—David Vu
*Assistant Examiner*—Arman Khosraviani
(74) *Attorney, Agent, or Firm*—Pillsbury Winthrop Shaw Pittman LLP

(57) ABSTRACT

The present invention is directed to different methods used in the formation of an ink, as well as being directed to the formation of layers used in the fabrication of a solar cell, particularly the absorber layer. In one embodiment, the invention is directed to formulating an ink comprising Cu-rich particles and solid Ga—In particles, wherein the step of formulating is carried out at a temperature such that no liquid phase is present within the solid Ga-In particles. In another embodiment, the specific steps taken during the formulation of the ink are described. In yet another embodiment, the process of using the formulated ink to obtain a precursor layer are described.

12 Claims, 4 Drawing Sheets

U.S. PATENT DOCUMENTS

| | | | |
|---|---|---|---|
| 5,326,719 A * | 7/1994 | Green et al. | 438/479 |
| 5,362,331 A * | 11/1994 | Tada et al. | 148/98 |
| 5,462,821 A * | 10/1995 | Onoue et al. | 429/218.1 |
| 5,610,371 A * | 3/1997 | Hashimoto et al. | 174/262 |
| 5,653,856 A * | 8/1997 | Ivanov et al. | 204/192.12 |
| 5,746,927 A * | 5/1998 | Hashimoto et al. | 216/18 |
| 6,550,665 B1 * | 4/2003 | Parrish et al. | 228/180.22 |
| 2002/0006470 A1 * | 1/2002 | Eberspacher et al. | 427/216 |

FOREIGN PATENT DOCUMENTS

| | | |
|---|---|---|
| WO | WO 99/17889 | 4/1999 |
| WO | WO 02/084708 A2 | 10/2002 |

OTHER PUBLICATIONS

Subramanian et al., The Cu-In (Copper-Indium System), Bulletin of Alloy Phase Diagrams, vol. 10 (No. 5), pp. 554-568, (1989).

Norsworthy, et al., CIS film growth by metallic ink coating and selenization, Solar Energy Materials & Solar Cells, Elsevier Science B.V. (Netherlands), pp. 127-134, (2000).

Hansen, Ga-In (Gallium-Indium), Consitution of Binary Alloys, McGraw Hill Book Company, pp. 745-746, (1958).

* cited by examiner

LOW TEMPERATURE NANO PARTICLE PREPARATION AND DEPOSITION FOR PHASE-CONTROLLED COMPOUND FILM FORMATION

This application is a continuation-in-part of U.S. patent application Ser. No. 10/474,259 filed May 19, 2004 now U.S. Pat No. 7,091,136 and U.S. patent application Ser. No. 11/070,835 filed Mar. 1, 2005, each of which are expressly incorporated by reference herein, and also claims priority from U.S. Provisional Application Ser. No. 60/567,459 filed May 4, 2004, U.S. Provisional Application Ser. No. 60/283,630 Apr. 16, 2001 and U.S. Provisional Application Ser. No. 60/548,297 Mar. 1, 2004, all of which are also expressly incorporated by reference herein.

FIELD OF THE INVENTION

The present invention relates to method and apparatus for preparing thin films of semiconductors and more specifically growing of compound semiconductor films as absorber layers for solar cell structures.

BACKGROUND

Solar cells are devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_2$ (where $0 \leq x \leq 1$ and $0 \leq y \leq 1$) have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the Ga/(Ga+In) molar ratio. In general, for good device performance Cu/(In+Ga) molar ratio is kept at or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation (X,Y) in chemical formula means all chemical compositions of X and Y from (X=0% and Y=100%) to (X=100% and Y=0%). For example, Cu(In,Ga) means all compositions from CuIn to CuGa.

The first technique that yielded high-quality $Cu(In,Ga)Se_2$ films for solar cell fabrication was co-evaporation of Cu, In, Ga and Se onto a heated substrate in a vacuum chamber. This technique is still popular in terms of growing absorber layers that yield high conversion efficiencies in thin film solar cell structures. However, low materials utilization, high cost of equipment, difficulties faced in large area deposition and relatively low throughput are some of the challenges faced in commercialization of the co-evaporation approach.

Another technique for growing $Cu(In,Ga)(S,Se)_2$ type compound thin films for solar cell applications is a two-stage process where at least two components of the $Cu(In,Ga)(S,Se)_2$ material are first deposited onto a substrate, and then reacted with each other and/or with a reactive atmosphere in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S,Se)_2$ layer can be grown. Addition of Ga in the precursor layer allows the growth of a $Cu(In,Ga)(S,Se)_2$ absorber.

There are many other versions of the two-stage process that have been employed by different research groups. For example, stacked layers of sputter deposited (Cu—Ga)/In, and co-evaporated (In—Ga—Se)/(Cu—Se), and (In—Ga—Se)/Cu stacks have all been used as precursor materials which were reacted at high temperatures with S and or Se to form the final absorber film. In two-stage processes individual thicknesses of the layers forming the stacked structure are controlled so that the two molar ratios mentioned before, i.e. the Cu/(In+Ga) ratio and Ga/(Ga+In) ratio, can be kept under control from run to run and on large area substrates.

Sputtering or evaporation techniques have been used in prior art approaches to deposit the layers containing the Group IB and Group IIIA components of the precursor stacks. In the case of $CuInSe_2$ growth, for example, Cu and In layers were sputter-deposited on non-heated substrates and then the composite film was selenized in $H_2Se$ gas or Se vapor at an elevated temperature, as described in U.S. Pat. No. 4,798,660. More recently, Ga was introduced into the compound film by including Ga in the sputter deposited precursor stack. Such techniques suffer from high cost of capital equipment, and relatively slow rate of production as well as difficulties to control individual thicknesses of layers.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as of a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the ohmic contact to the device. Various conductive layers comprising Mo, Ta, W, Ti, stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the superstrate side.

A variety of materials, deposited by a variety of methods, can be used to provide the various layers of the device shown in FIG. 1. These deposition techniques are well known in the field and will not be repeated here. The present invention concerns itself more with the growth of the absorber film 12, which is the heart of the solar cell structure.

As reviewed above, vacuum processes such as co-evaporation and sputtering are expensive techniques. With a goal of finding an inexpensive approach to absorber layer fabrication, research groups have investigated techniques comprising the steps of: i) preparing a precursor in the form of an ink or slurry containing particles or powders of all or some of the components of $Cu(In,Ga)(S,Se)_2$ compound, ii) depositing the ink or slurry on a substrate using methods such as spraying, doctor-blading and screen printing, to form a precursor layer comprising particles of the ink, and iii) reacting the particle or powder-based precursor layer at elevated temperatures typically with Se and/or S to from the compound film. In the formation of the inks or slurries well known agents such as liquid carriers, dispersants, surfactants etc. were used in conjunction with the powders to form well behaved solutions that could be coated on substrates in thin film form.

Some of the above particle-based approaches utilized powders of Group IBIIIA-selenides (such as $CuInSe_2$ powders), mixtures of Group IB and Group IIIA binary selenide powders (such as mixtures of $Cu_xSe$ and $In_2Se_3$ powders), mixtures of Cu-oxide and In-oxide powders, or powders of ternary oxides (such as Cu—In-Oxide powders). Such techniques, although could provide macro-scale stoichiometric or compositional control of the film deposited, had several shortcomings. Screen printed layers utilizing selenide powders, for example, did not yield high efficiency devices due to the poor micro-structure of the layers which were difficult to fuse and form dense and large grains during the reaction/annealing step. Oxide powders required high temperatures and extra processing steps to reduce the oxygen content of the resulting compound film after the reaction step.

Use of metallic particles in the formulation of inks is an attractive approach since precursor layers obtained by depositing such inks on substrates in the form of thin layers may be readily converted into compound layers by reaction with S, Se or Te. One of the first attempts to use metallic powders for $CuInSe_2$ growth involved; i) mixing of Cu powder and In powder in a suitable liquid carrier, ii) milling the powders in the liquid carrier to intimately mix them and reduce their particle size to form a slurry, iii) depositing the slurry on a substrate to form a precursor layer, and iv) reacting the precursor layer with selenium to form $CuInSe_2$. The quality of films formed by this technique was quite poor as evidenced by the poor conversion efficiency of solar cells fabricated on them.

Indium is a soft material. Therefore, milling of In powder for particle size reduction is not very efficient. When In particles are milled, they may actually increase in size due to fusing under the mechanical stress introduced by the mill such as a ball mill. If In particles are milled together with other species, such as Cu particles, they may coat the Cu particles and also react with them due to the mechanical energy imparted by the mill. In other words, material phase content of each particle may change as a function of the milling conditions used.

It is known that Ga needs to be included in the compound absorber layer for the highest efficiency solar cell fabrication. Although about 10% efficient solar cells have been fabricated on $CuInSe_2$ absorbers, solar cell efficiencies in excess of 16% have been regularly demonstrated on absorbers containing Ga, and in some cases Ga and S. Such absorbers typically have a Ga/(Ga+In) ratio of 0.20 or larger.

Adding Ga into the composition of metallic powder-based precursors is challenging. Gallium, like In, is a soft material. It is reactive and also has a low melting point of about 30° C. Therefore, problems associated with addition of indium into the powder-based ink formulations discussed above are even worse for ink formulations containing Ga powder. Low melting temperature and reactivity of Ga does not allow efficient milling because under the mechanically supplied energy by the mill Ga melts and reacts with other species, especially with In. If there are Cu particles in the formulation, Ga reacts with those particles also and coats the Cu particles, causing them to grow in size. Inks with large particle size are not suitable for the formation of compound layers because large particles cause local compositional variations in the compound layers formed by reacting them with Group VIA materials.

One prior-art technique used for preparing inks comprising metallic particles involved; i) preparation of Group IBIIIA alloy containing particles, with Group IBIIIA alloys constituting greater than about 50 molar percent of the Group IB elements and greater than about 50 molar percent of the Group IIIA elements required in the overall composition, ii) milling the powder for size reduction and formation of an ink, iii) deposition of the ink on a substrate to form a precursor layer, and iv) reacting the precursor layer with a Group VIA vapor to convert it into a Group IBIIIAVIA compound film. Since the above specified Cu—In and Cu—Ga alloy particles are not as soft as In particles or Ga particles, this approach reportedly avoided some of the previously discussed problems associated with milling In and Ga particles in the presence of Cu particles. However, milling still changed the phase content of the precursor ink, and once deposited on the substrate the ink formed porous precursor layers as reported by G. Norsworthy et al (Solar Energy Materials and Solar Cells, vol. 60, p. 127, 2000).

FIGS. 2 and 3 demonstrate the fundamental shortcoming of a method using multi-phase metallic particles which are milled for particle size reduction during an ink preparation step. FIG. 2 shows an exemplary starting material which is a powder mixture 20. The powder mixture 20 comprises Cu—In alloy particles 21 and Cu—Ga alloy particles 22. Let us assume that particle size of the powder mixture 20 is in the order of 1000 nm, which is high for ink formulation. To have a target Cu/(In+Ga) ratio of 1.0 and a target Ga/(Ga+In) ratio of 0.3, the Cu—In alloy particles 21 of FIG. 2 may have a Cu/In ratio of 1.0 and the Cu—Ga alloy particles 22 may have a Cu/Ga ratio of 1.0. By mixing one mole of Cu—In alloy particles 21 with about 0.43 moles of Cu—Ga alloy particles 22 the powder mixture 20 would have the desired overall composition in macro scale.

The alloy particles of the above example may be obtained by various techniques. One such approach is melt atomization technique which involves spraying of Cu—In melt or Cu—Ga melt with the desired compositions into a container filled with inert gas. Atomized melt droplets cool down once they leave the atomizing spray nozzle and solidify to form near-spherical particles with diameters ranging from a few microns to tens of microns. By sieving, the smallest particles may be separated and used for milling and ink formation.

The Cu—In and Cu—Ga alloy particles formed as described above are multi-phase particles due to their composition. This can be seen from the Cu—In and Cu—Ga binary phase diagrams duplicated in FIGS. 4a and 4b, respectively. The Cu—In particles of the present example have an overall compositional ratio of Cu/In=1. This composition is indicated by the arrow 40 in the replicated Cu—In phase diagram of FIG. 4a. As can be seen from FIG. 4a, there is no stable phase with 50% In in Cu. Therefore, the Cu—In alloy particles 21 of the present example may contain one or more Cu-rich phases of $Cu_{11}In_9$, $Cu_4In$, $Cu_7In_4$, $Cu_9In_4$, $Cu_{16}In_9$, and one or more In-rich phases such as In and $CuIn_2$. Similarly, the Cu—Ga alloy particles 22 with a composition of 50% Cu and 50% Ga (shown by the arrow 41 in FIG. 4b) may comprise Cu-rich phases such as $Cu_9Ga_4$, $Cu_3Ga_2$ and Ga-rich phases such as Ga and $CuGa_2$. Physical distribution of these complex phases within and on each particle is expected to be quite random and complex. A highly simplified demonstration of this fact is shown in FIG. 3. In FIG. 3 exemplary phase contents of one of the Cu—In alloy particles and one of the Cu—Ga alloy particles of FIG. 2 are shown. Accordingly, the Cu—In alloy particle 21 of FIG. 3 comprises a Cu-rich region 23 and an In-rich region 24. The Cu-rich region may comprise at least one of the Cu-rich phases cited above ($Cu_{11}In_9$, $Cu_4In$, $Cu_7In_4$, $Cu_9In_4$, $Cu_{16}In_9$) and the In-rich region may comprise at least one of the In-rich phases such as In and $CuIn_2$. Similarly, the Cu—Ga alloy particle 22 may comprise Ga-rich regions 25 and Cu-rich region 26. The Cu-rich region may comprise one or more Cu-rich phases cited above ($Cu_9Ga_4$, $Cu_3Ga_2$) and the Ga-rich region may comprise one or more Ga-rich phases such as Ga and $CuGa_2$. As discussed before, the phase content and distribution of particles shown in FIG. 3 are highly simplified just to demonstrate the point. Actual distribution of phases within each particle is a much more complex, three-dimensional problem.

FIG. 3 also shows an exemplary breakage of the Cu—In alloy particle 21 and the Cu—Ga alloy particle 22 in smaller pieces after a particle reduction step such as a ball milling step. It should be understood that the Cu—In alloy particles 21 and Cu—Ga alloy particles 22 of FIG. 2 may be mixed with a suitable liquid or carrier before the milling step. Suitable chemical agents such as surfactants, dispersion agents and thickening agents may also be added to this solution, which, after milling becomes an ink or dispersion to be deposited on a substrate surface to form a precursor layer. As represented in FIG. 3, after the milling step the particles are broken into smaller pieces. Specifically, in the example of FIG. 3, the Cu—In alloy particle 21 is broken into four pieces A, B, C and D. The Cu—Ga particle 22 is broken into three pieces E, F and G. As can be appreciated, the smaller particles, A, B, C, D, E, F, and G, which are now in the formulation of the ink all have a different composition and phase content. For example, pieces A and B are highly In-rich, whereas pieces C and D contain differing amounts of a Cu-rich phase. Particle E is Cu-rich, whereas pieces F and G contain different amounts of Ga-rich phases. When the ink comprising these particles of differing compositions is deposited on a substrate in the form of a thin layer and then dried, a precursor film forms. Although the composition of this precursor layer in macro scale is at the targeted level i.e. Cu/(Ga+In) ratio of 1.0 and Ga/(Ga+In) ratio of 0.3; in micro scale, locally, it may be quite different since the particles in the ink have differing phase content and composition. If, for example, in a 10000 nm by 10000 nm area of the film more of the particles A, B, G and F land, that area may become highly In and Ga-rich, whereas a neighboring micro-region may contain more Cu-rich particles and thus have an overall Cu-rich composition. After such a precursor is reacted with Group VIA materials to form the compound layer, such non-uniform areas of the precursor layer are translated into compound film regions of undesired composition. Solar cells fabricated on such compound layers have low efficiencies.

As the brief review above demonstrates, there is still need to develop low-cost deposition techniques to form high-quality, dense Group IBIIIAVIA compound thin films with uniform macro and micro-scale composition.

SUMMARY OF THE INVENTION

The present invention is directed to different methods used in the formation of an ink.

The present invention is also directed to the formation of layers used in the fabrication of a solar cell, particularly the absorber layer.

In another embodiment, the present invention is directed to formulating an ink, with further embodiments described of using a formulated ink in the deposition of a precursor layer that will become the absorber layer of the solar cell.

In one embodiment, the invention is directed to formulating an ink comprising Cu-rich particles and solid Ga—In particles, wherein the step of formulating is carried out at a temperature such that no liquid phase is present within the solid Ga—In particles.

In another embodiment, the specific steps taken during the formulation of the ink are described.

In yet another embodiment, the process of using the formulated ink to obtain a precursor layer are described.

BRIEF DESCRIPTION OF THE DRAWINGS

The foregoing aspects and advantages of the present invention, among others, will become better understood upon reading the following detailed description and upon reference to the drawings where.

DETAILED DESCRIPTION

The present invention provides a method that avoids the compositional non-uniformities of prior-art methods and also provides approaches to formulate inks or slurries comprising particles of low melting elements and alloys.

According to a preferred embodiment of the present invention inks containing Ga and Ga—In alloys are processed at low temperatures using particles of Ga and Ga—In. For example Ga particles that are smaller than about 200 nm are mixed with Cu and In particles which are also smaller than 200 nm in size. The powder mixture is dispersed in a carrier liquid such as water or organic solvent at a temperature lower than about 15° C. No milling is carried out for particle reduction. Mechanical agitation or sonication is used to disperse the powders in the carrier and obtain a dispersion. Additives such as surfactants (like sodium lauro sulfate), dispersant agents (available from Rohm and Haas) and thickening agents may be added to the formulation for improving the ink or dispersion properties. Although sonication and mechanical agitation imparts energy and provides heat to the dispersion, cooling means are used to keep the temperature below the melting temperature of Ga throughout the ink preparation step to assure that all particles stay solid and they do not fuse together and form agglomerates or large particles. Once prepared, the chilled metallic ink comprising the Cu, In and Ga particles is deposited on the substrate to form a precursor layer comprising metallic particles that are small in size (<200 nm) and have not reacted with each other since they have been processed at low temperatures. This way phase content of each particle is stable from the time they are added to the ink formulation to the time they are transferred onto the substrate and form a precursor layer, and the particle size is well established and small.

In another preferred embodiment In and Ga are introduced in the formulation as a multi-phase alloy. However, unlike in prior art technique, each particle of this alloy powder is small (preferably smaller than about 200 nm in size) and compositionally uniform. Since the composition from particle to particle does not change and since the particles are not milled and broken, inks and precursor layers prepared using such inks are extremely uniform in both macro-scale and micro-scale. A specific example of forming the In—Ga particles and inks will now be described.

Figure 6:
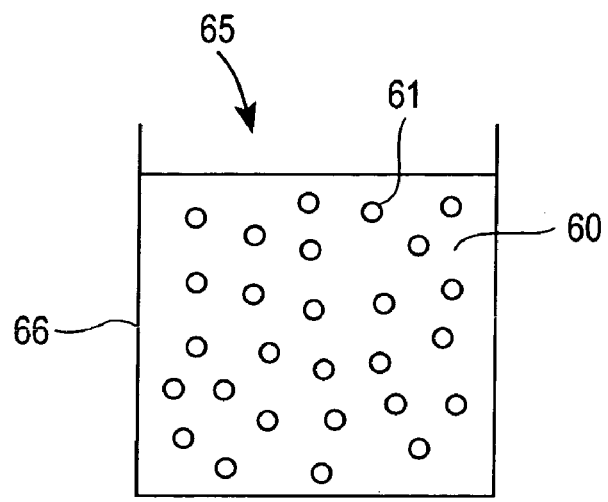
FIG. 6 shows an emulsion formed of melt particles in a liquid.
Figure 5:
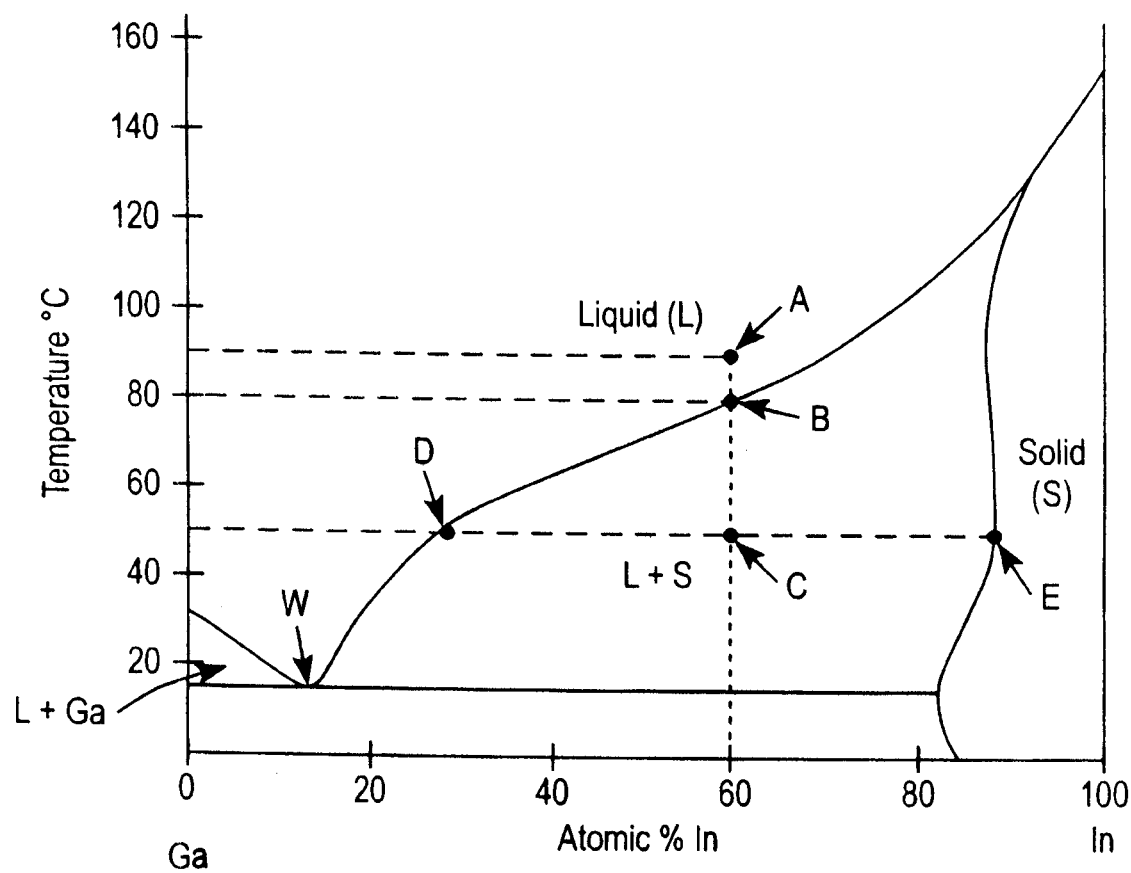
Figure 6:
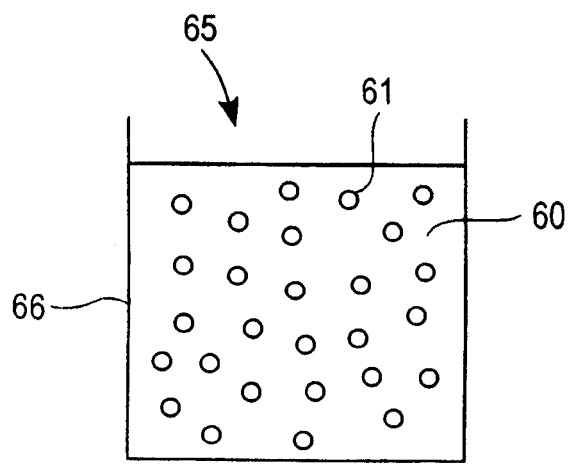

A method was described in a parent provisional patent application owned by the present inventor (Low Cost Deposition of Semiconductor Film, filed Mar. 1, 2004, Ser. No. 60/548,297) where an emulsion of In—Ga particles was formed in a liquid base and this emulsion was deposited on a substrate to form a precursor layer. FIG. 6 schematically shows such an emulsion 65 that may be formed by putting In—Ga melt in a liquid 60 contained in a container 66. The liquid 60 is kept at above the melting point of the melt. The melt/liquid mixture is mechanically agitated vigorously to divide the melt into nano size particles 61. Since the melt has a highly uniform composition, each of the melt particles 61 also have the same uniform composition in terms of molar ratio of Ga/(Ga+In).

Figure 1:
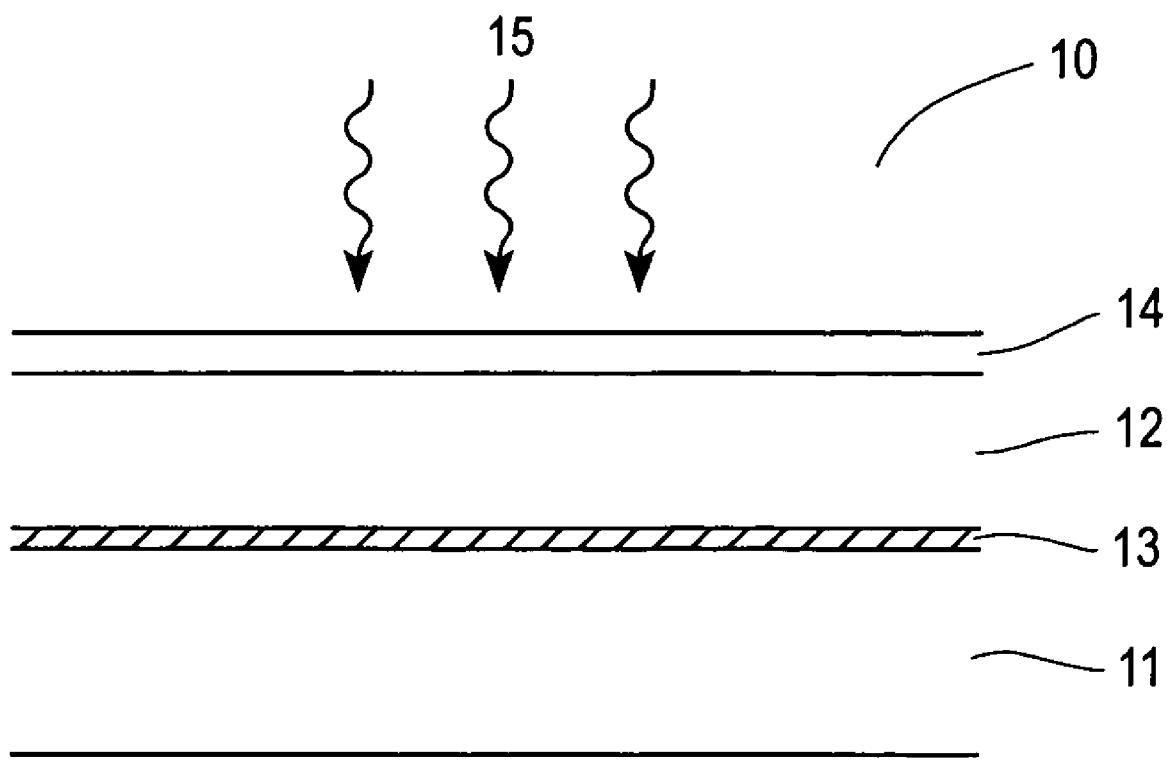
FIG. 1 is a cross-sectional view of a solar cell employing a Group IBIIIAVIA absorber layer.
Figure 2:
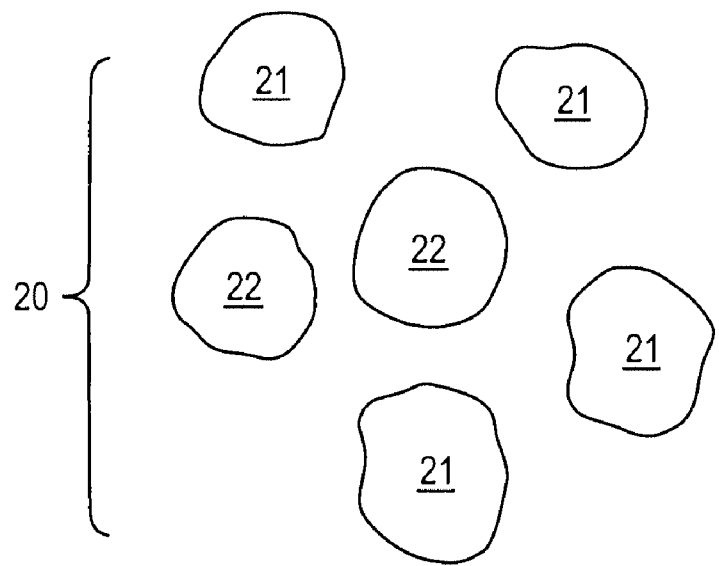
FIG. 2 shows a prior-art starting material comprising alloy particles.
Figure 3:
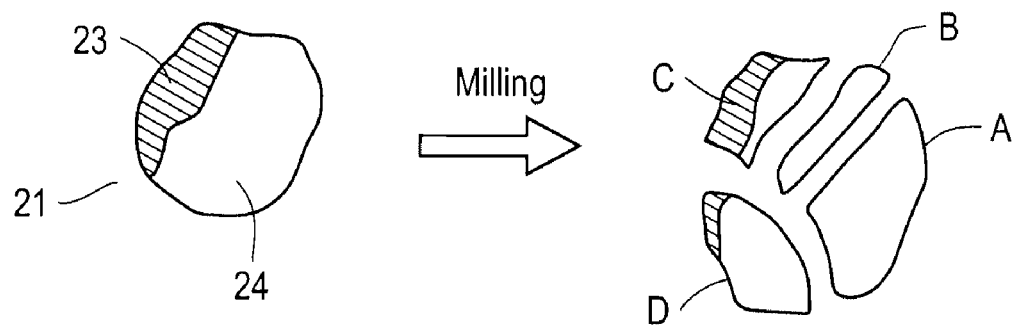
FIG. 3 shows how the non-uniform phase content of the prior-art alloy particles can cause non-uniform composition in sub-particles resulting from a milling operation.
Figure 3:
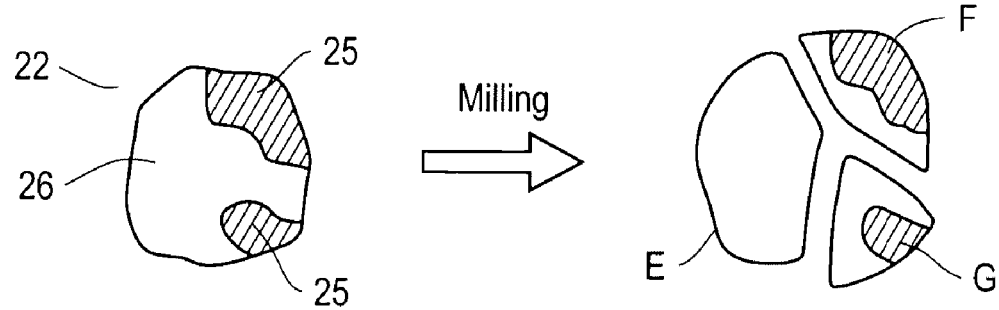
Figure 4A:
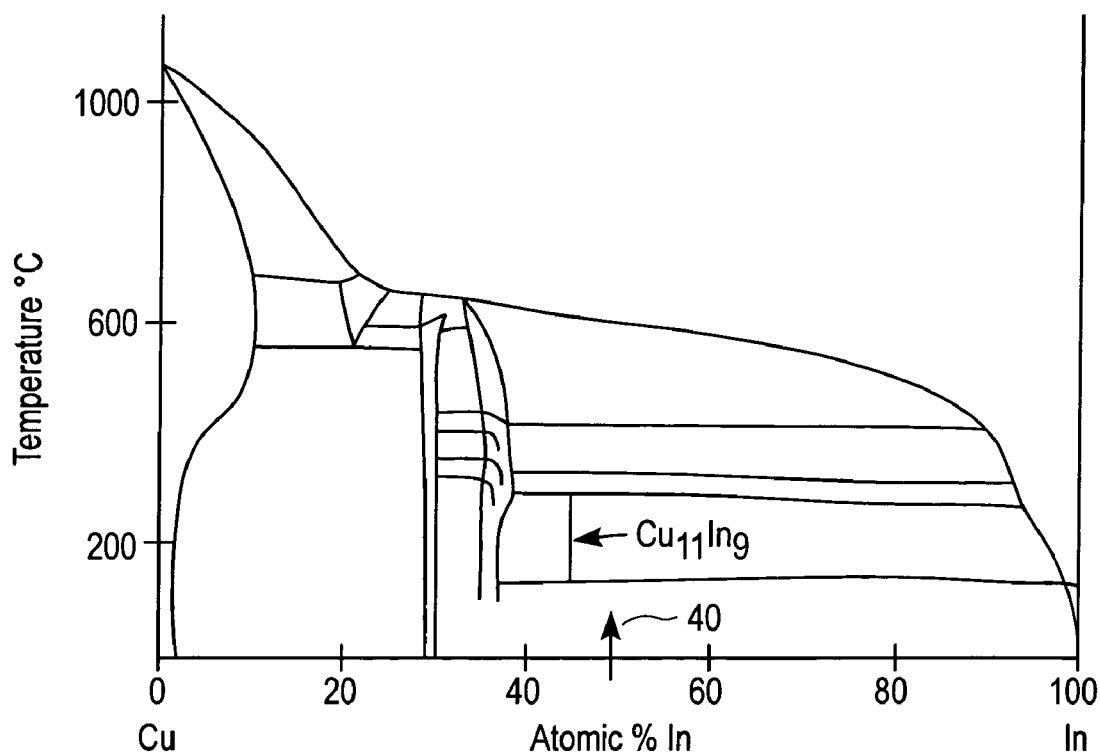
FIG. 4A is a schematic representation of Cu—In phase diagram.
Figure 4B:
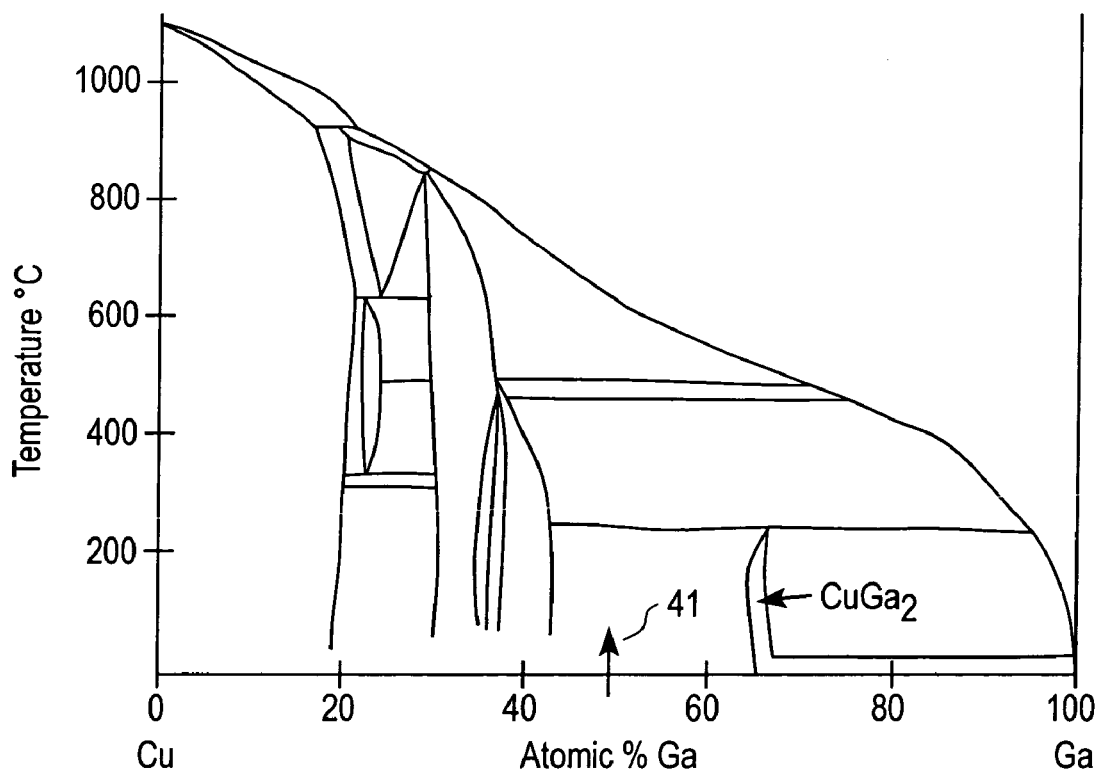
FIG. 4B is a schematic representation of Cu—Ga phase diagram.
Figure 5:
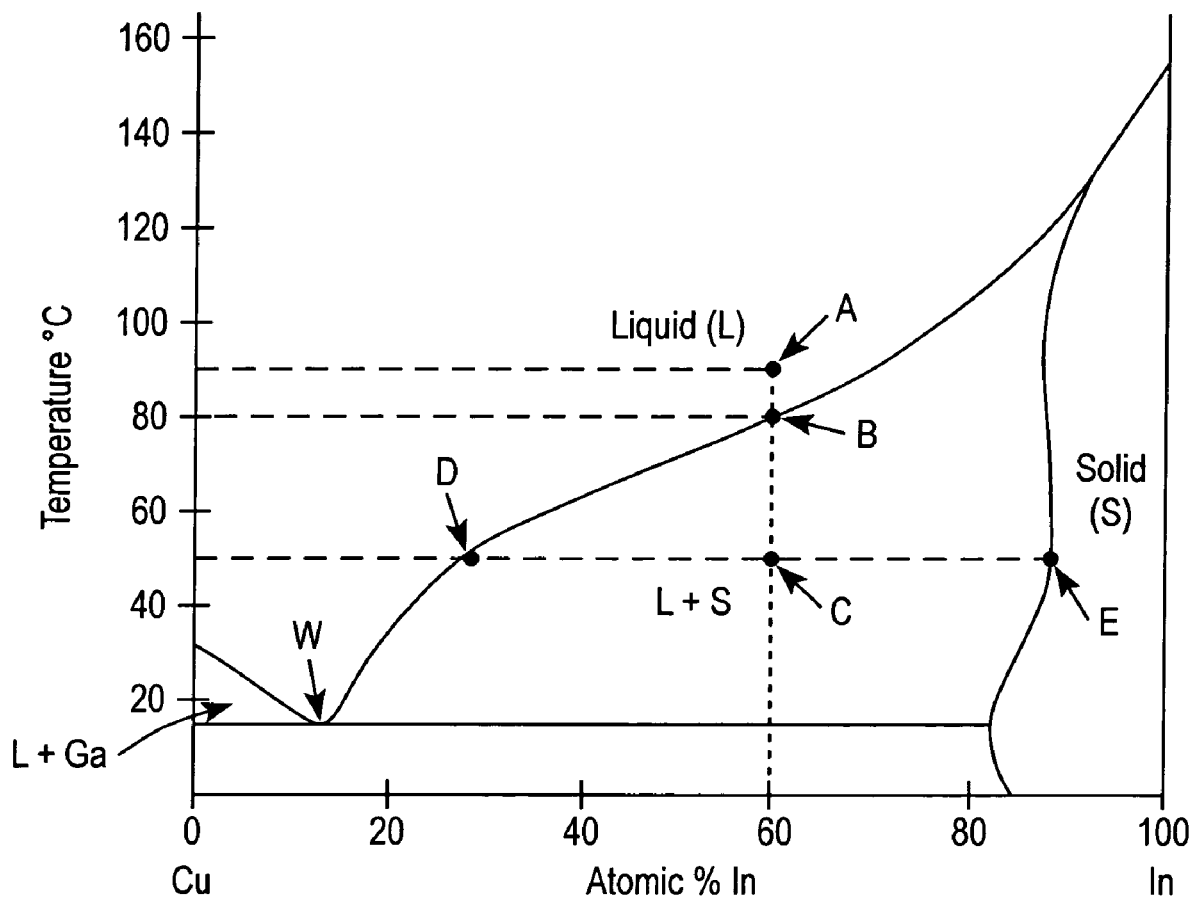
FIG. 5 is a schematic representation of In—Ga phase diagram.

The In—Ga binary phase diagram of FIG. 5 shows that as Ga is added to In, the melting temperature of Ga—In gets reduced. Let us, as an example, take the case where the desired Ga/(Ga+In) ratio is 0.4. To achieve this composition enough Ga and In are weighed separately and mixed. The mix is then heated to form a uniform melt. According to the phase diagram of FIG. 5 the melting temperature of this specific composition is about 80° C. Let us assume we keep the melt at 90° C. and then pour it into the liquid 60 which is also kept at 90° C. There are many different types of liquids that may be used for this purpose. Silicone based oils among other types of mineral oils may all be effectively used to disperse the Ga—In melt by mechanical agitation and form an emulsion. For higher Ga compositions with lower melting points, even water based solutions may be effectively used. Point A in FIG. 5 represents the composition of a melt particle 61 in the liquid 60 at 90° C. After dispersing the melt and forming nano-size melt particles, the temperature of the liquid is reduced, reducing the temperature of the melt particles. At a temperature of about 80° C. represented by point B in FIG. 5, the melt particle starts to form a solid phase. As the temperature is further reduced to, for example 50° C. (as represented by point C) each nano-size particle in the liquid is expected to contain a solid phase S and a liquid phase L. The solid phase, which is an In—Ga solid solution, would have an In-rich composition dictated by point E (about 90% In according to the phase diagram of FIG. 5) and the liquid phase would have a Ga-rich composition shown by point D (about 30% In according to the phase diagram of FIG. 5). As the temperature is lowered down to room temperature of about 20° C., the composition of the liquid phase would get more Ga-rich (about 85% Ga and 15% In). As should be appreciated particles containing a liquid phase at room temperature cannot be effectively used in preparation of inks at that temperature because during dispersing the particles with other particles, liquid phases would merge and fuse forming particle agglomerates. Liquid phase would also easily react with other species and change the phase content of the particles. Accordingly, the present invention provides for cooling the temperature of the liquid 60 to below about 15° C. where an eutectic point W exists between Ga and In. Once the temperature is lowered below 15° C. all particles solidify and they all contain the same amount of In and Ga given by the fixed ratio of Ga/(Ga+In) in the original melt and their phase content is very similar (an In rich solid phase and a Ga-rich solid phase). It should be noted that any Ga—In composition, unless it is within the solid solution region S to the right of the phase diagram in FIG. 5 would contain a liquid phase unless its temperature is lowered to or below the temperature at the eutectic point W. This temperature is around 15° C. Particles prepared by this approach have sizes smaller than 200 nm and preferably smaller than 100 nm. They are washed out of the solution and cleaned using solvents chilled to temperatures lower than 15° C. Then the In—Ga particles of uniform composition are mixed by Cu powder at the desired stoichiometric Cu/(Ga+In) ratio such as a ratio in the range of 0.7-1.0 and the mixture is used to form a highly uniform ink. The Ga/(Ga+In) molar ratio may be in the range of 0.2-0.9, prefereably in the range of 0.3-0.7. It should be noted that all these process steps have to be carried out at low temperature, preferably below about 15° C., to avoid formation of a liquid phase in the Ga—In particles. Once the ink comprising Cu particles and Ga—In particles is deposited on a substrate to form a precursor layer, the precursor layer may be heated up to room temperature or above room temperature. At this time after the precursor layer formation it is beneficial to allow formation of a liquid phase in or on the surface of the In—Ga particles. Such liquid phase helps fuse the particles together and helps form a dense precursor film which may than be reacted with Group VIA elements to form a dense and compositionally uniform compound layer.

It should be noted that one attractive feature of the present invention is the low process temperatures used in powder formation, ink formulation and ink deposition. This lowers the cost of processing and simplifies manufacturing. Low melting temperatures of Ga and Ga—In alloys, which present challenges in prior art techniques are actually used to the benefit of the processing engineer in the present invention. The processing of the present invention may be carried out at a temperature range of −5 to 20° C., preferably in the 0 to 15° C. range.

Although the preferred composition of the ink comprises Cu particles and In—Ga particles, it is possible to use Cu—In particles (in the form of Cu—In alloy particles or Cu—In solid solution particles) and/or Cu—Ga particles (in the form of Cu—Ga alloy particles or Cu—Ga solid solution particles) instead of or in addition to the Cu particles. Furthermore, In particles may also be added to the overall formulation. The particle size for all powders used is smaller than 200 nm, preferably smaller than 100 nm. Although the phase distribution within the Ga—In particles is not critical for the present invention, the simple phase diagram of In—Ga assures that within each particle there would be a solid phase (which is a solid solution of Ga in In) and a Ga-rich phase which is initially a liquid and then is solidified during cooling down. If the cooling ramp during the near-spherical Ga—In nanoparticle formation is controlled (slow cooling of 1-10° C. per minute) it is possible to have each particle contain the In-rich phase at the core of the spheres and the Ga-rich phase at the surface. This is a preferred phase distribution within each particle, because after deposition of the ink and formation of a precursor layer, a dense structure is formed comprising these spherical particles. Upon heating to room temperature the Ga-rich phase on the surface of the particles melts and fuses with neighboring particle surfaces forming a fused layer that is not powdery any more.

After the preparation of an ink using the powder mixtures of the present invention a precursor layer may be deposited by various means such as doctor blading, gravure deposition, spin coating, dip coating, roll coating and spraying. In one embodiment the precursor layer which comprises Cu, In and Ga (Group III material provided either as In powder and Ga powder or in the form of Ga—In powder or a mixture of both) is exposed to Group VIA element(s) at elevated temperatures. These techniques are well known in the field and they involve heating the precursor layer to a temperature range of 350-600° C. in the presence of at least one of Se vapors, S vapors, and Te vapors provided by sources such as solid Se, solid S, solid Te, $H_2Se$ gas, $H_2S$ gas etc. In another embodiment a layer or multi layers of Group VIA materials are deposited on the precursor layer and the stacked layers are then heated up in a furnace or in a rapid thermal annealing furnace and like. Group VIA materials may be evaporated on, sputtered on or plated on the precursor layer. Alternately inks comprising Group VIA nano particles may be prepared and these inks may be deposited on the precursor layers to form a Group VIA material layer comprising Group VIA nano particles.

Reaction may be carried out at elevated temperatures of 350-600° C. for times ranging from 1 minute to 30 minutes depending upon the temperature. As a result of reaction, the Group IBIIIAVIA compound is formed from the precursor.

Solar cells are completed using materials and methods known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art, and from the scope of the claims set forth below.

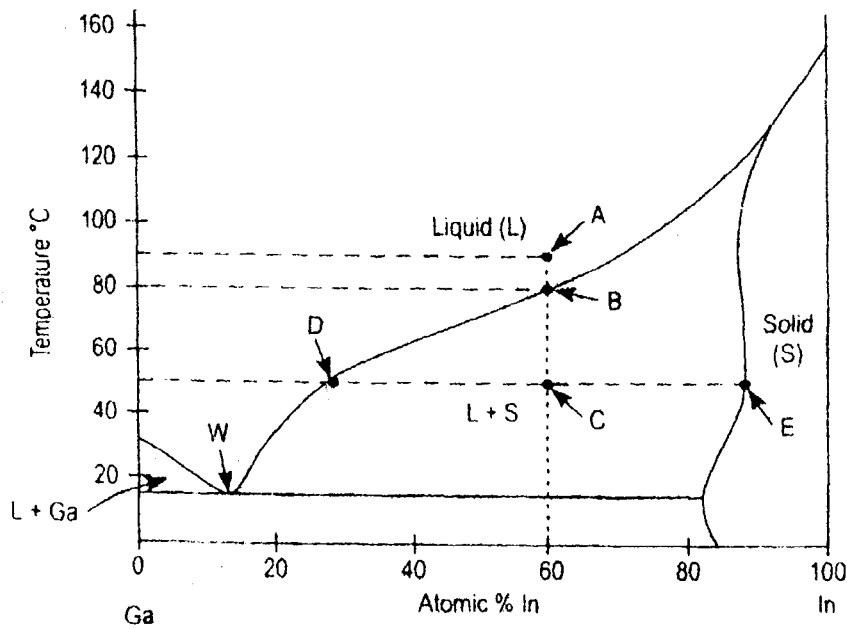

I claim:

1. A method comprising:
   formulating an ink comprising Cu-rich particles and solid Ga—In particles, wherein the step of formulating includes the steps of:
   placing solid Ga—In particles and Cu-rich particles into a carrier liquid having a temperature at or below 15° C., thereby forming a mixture,
   adding into the mixture at least one dispersion forming agent to form a second mixture and
   agitating the second mixture to form a dispersion while keeping the temperature of the carrier liquid at or below 15° C.;
   and further including the step of forming the solid Ga—In particles used in the step of placing, wherein the step of forming the solid Ga—In particles comprises:
   forming a Ga—In melt with a Ga/(Ga+In) molar ratio and a pre-determined melting temperature,
   adding the Ga—In melt in a liquid heated to at least to the pre-determined melting temperature,
   agitating the Ga—In melt and the liquid to form an emulsion comprising nano-size Ga—In melt particles,
   lowering the temperature of the emulsion to below 15° C. to solidify the nano-size Ga—In melt particles and to thereby form solid Ga—In particles, and
   removing the solid Ga—In particles.

2. The method of claim 1 further including the step of depositing the ink on a substrate to form a precursor layer for the growth of a $Cu(In,Ga)(VIA)_2$ compound film absorber of a solar cell.

3. The method of claim 2 wherein the temperature during the step of depositing is at or below 15° C.

4. The method of claim 2 further comprising the step of heating the precursor layer to above 15° C. to form a fused precursor layer.

5. The method of claim 4 further comprising the step of reacting the fused precursor layer with a Group VIA material to form the $Cu(In,Ga)(VIA)_2$ compound film.

6. The method of claim 5 wherein the Group VIA material is at least one of Se and S and the step of reacting is carried out at a temperature of 350-600° C.

7. The method of claim 6 further comprising the step of depositing a transparent layer on the $Cu(In,Ga)(VIA)_2$ compound film to fabricate the solar cell.

8. The method according to claim 1 wherein the largest dimension of the Cu-rich particles and the solid Ga—In particles is less than 200 nm.

9. The method of claim 1, wherein the ink further comprises at least one of Ga particles and In particles.

10. The method of claim 1 wherein the amount of Cu-rich particles and Ga—In particles placed into the carrier liquid is selected to obtain a pre-determined Cu/(In+Ga) molar ratio and a pre-determined Ga(Ga+In) ratio in the second mixture.

11. The method of claim 10 wherein the predetermined Cu/(In+Ga) molar ratio is in the range of 0.7-1.0 and the predetermined Ga/(Ga+In) molar ratio is in the range of 0.2-0.8.

12. The method of claim 1 wherein the carrier liquid is water.

* * * * *

UNITED STATES PATENT AND TRADEMARK OFFICE
CERTIFICATE OF CORRECTION

| | | |
|---|---|---|
| PATENT NO. | : 7,537,955 B2 | |
| APPLICATION NO. | : 11/123886 | |
| DATED | : May 26, 2009 | |
| INVENTOR(S) | : Bulent M. Basol | |

It is certified that error appears in the above-identified patent and that said Letters Patent is hereby corrected as shown below:

The title page should be deleted to appear as per attached title page.

The sheet of drawings consisting of figure 5, should be deleted to appear as per attached figure 5.

Signed and Sealed this
Eighteenth Day of December, 2012

David J. Kappos
*Director of the United States Patent and Trademark Office*

(12) United States Patent
Basol

(10) Patent No.: US 7,537,955 B2
(45) Date of Patent: May 26, 2009

(54) LOW TEMPERATURE NANO PARTICLE PREPARATION AND DEPOSITION FOR PHASE-CONTROLLED COMPOUND FILM FORMATION

(76) Inventor: Bulent M. Basol, 3001 Maple Ave., Manhattan Beach, CA (US) 90266

(*) Notice: Subject to any disclaimer, the term of this patent is extended or adjusted under 35 U.S.C. 154(b) by 296 days.

(21) Appl. No.: 11/123,886

(22) Filed: May 4, 2005

(65) Prior Publication Data
US 2005/0266600 A1 Dec. 1, 2005

Related U.S. Application Data

(63) Continuation-in-part of application No. 10/474,259, filed on May 19, 2004, now Pat. No. 7,091,136, and a continuation-in-part of application No. 11/070,835, filed on Mar. 1, 2005.

(60) Provisional application No. 60/567,459, filed on May 4, 2004, provisional application No. 60/548,297, filed on Mar. 1, 2004, provisional application No. 60/283,630, filed on Apr. 16, 2001.

(51) Int. Cl.
*H01L 21/00* (2006.01)
*H01L 31/00* (2006.01)
*B05D 5/12* (2006.01)
*B05D 7/00* (2006.01)

(52) U.S. Cl. .................. 438/57; 427/74; 427/216; 136/252; 136/253; 136/254; 136/255; 136/256; 136/257; 136/258; 136/259; 136/260; 136/261; 136/262; 136/263; 136/264; 136/265

(58) Field of Classification Search .................. 427/74, 427/216; 438/57; 136/240–265
See application file for complete search history.

(56) References Cited

U.S. PATENT DOCUMENTS 4,659,384 A * 4/1987 Daigo et al. .................. 106/35

(Continued)

FOREIGN PATENT DOCUMENTS

EP 0 838 864 A2 4/1998

(Continued)

OTHER PUBLICATIONS

Subramanian et al., Cu-Ga (Copper Gallium), Binary Alloy Phase Diagrams, pp. 1410-1412, undated.

(Continued)

*Primary Examiner*—David Vu
*Assistant Examiner*—Arman Khosraviani
(74) *Attorney, Agent, or Firm*—Pillsbury Winthrop Shaw Pittman LLP

(57) ABSTRACT

The present invention is directed to different methods used in the formation of an ink, as well as being directed to the formation of layers used in the fabrication of a solar cell, particularly the absorber layer. In one embodiment, the invention is directed to formulating an ink comprising Cu-rich particles and solid Ga—In particles, wherein the step of formulating is carried out at a temperature such that no liquid phase is present within the solid Ga-In particles. In another embodiment, the specific steps taken during the formulation of the ink are described. In yet another embodiment, the process of using the formulated ink to obtain a precursor layer are described.

12 Claims, 4 Drawing Sheets